(12) United States Patent
Schwarz et al.

(10) Patent No.: US 7,282,903 B2
(45) Date of Patent: Oct. 16, 2007

(54) LONGITUDINAL BALANCE MEASURING BRIDGE CIRCUIT

(75) Inventors: Richard Schwarz, Northfield, OH (US); Leo Staschover, Fort Lauderdale, FL (US)

(73) Assignee: Porta Systems Corporation, Syosset, NY (US)

( * ) Notice: Subject to any disclaimer, the term of this patent is extended or adjusted under 35 U.S.C. 154(b) by 0 days.

(21) Appl. No.: 11/517,042

(22) Filed: Sep. 7, 2006

(65) Prior Publication Data

US 2007/0096750 A1    May 3, 2007

Related U.S. Application Data

(60) Provisional application No. 60/714,811, filed on Sep. 7, 2005.

(51) Int. Cl.
*G01R 23/16* (2006.01)
(52) U.S. Cl. .................... 324/76.22; 324/666; 324/669
(58) Field of Classification Search ................ 324/666, 324/669, 76.22
See application file for complete search history.

(56) References Cited

U.S. PATENT DOCUMENTS 5,095,291 A    3/1992  Staschover et al. ............ 333/12

FOREIGN PATENT DOCUMENTS

GB         2176301 A   * 12/1986

OTHER PUBLICATIONS

International Telecommunication Union, *Measuring arrangements to assess the degree of unbalance about earth.* Series O: Specifications of Measureing Equipment. Mar. 1999.

* cited by examiner

*Primary Examiner*—Walter Benson
(74) *Attorney, Agent, or Firm*—Gerald T. Bodner

(57) ABSTRACT

A longitudinal balance measuring bridge circuit includes a common mode signal injection circuit in the form of a center tapped, 4:1 balanced matching transformer. The signal injection circuit is coupleable to an item under test (IUT) and to a source of common mode signal, and provides the common mode signal to the IUT. The common mode signal injection circuit includes balanced outputs. A common mode filter is coupled to the balanced outputs of the common mode signal injection circuit and attenuates the common mode signal. The common mode filter also includes balanced outputs on which are provided a transverse signal resulting from the common mode signal provided to the IUT. A signal output balun is coupled to the balanced outputs of the common mode filter and converts the transverse signal to an unbalanced signal.

21 Claims, 6 Drawing Sheets

LONGITUDINAL BALANCE MEASURING BRIDGE CIRCUIT

CROSS REFERENCE TO RELATED APPLICATION

This application is related to U.S. Provisional Application Ser. No. 60/714,811, filed on Sep. 7, 2005, and entitled "Longitudinal Balance Measuring Bridge Circuit", the disclosure of which is incorporated herein by reference and on which priority is hereby claimed.

BACKGROUND OF THE INVENTION

1. Field of the Invention

The present invention generally relates to circuits which measure the amount of unbalance in a balanced circuit, such as transmission lines, and more particularly relates to longitudinal balance measuring bridge circuits.

2. Description of the Prior Art

For reasons of convenience and cost, balanced lines such as twisted pair, are much preferred in data transmission to single-ended wiring, such as coaxial cables. Depending on the degree of balance between the pairs, minimal electromagnetic radiation of the transmitted signal and pick-up of interfering signals are achieved without complex shielding. A balanced transmission system, shown in FIG. 1, consists of two conductors, A and B, neither of which is grounded. We define two voltages:

The transmitted signal, i.e. the voltage, $V_T$, between A and B is known as "transverse" or, in old telephone parlance, "metallic."

The algebraic average of $V_A$ and $V_B$, i.e.

$$V_L = (V_A + V_B)/2$$

is known as "longitudinal" or "common mode". This is the voltage one would measure from the electrical midpoint between A and B to ground. Such a midpoint is most easily established by a center-tapped transformer connected between the balanced terminals, as shown in FIG. 1.

Presence of common mode voltage is not necessarily harmful. However, a given signal having both transverse and longitudinal voltage components indicates unbalance, i.e. either signal has been partially converted into the other. Picked-up common mode voltage converted into a transverse voltage will cause interference and transverse voltage converted to longitudinal voltage will result in radiation.

ITU-T, the Telecommunication Standardization Sector of the International Telecommunications Union, has issued Recommendation O.9, entitled "Measuring Arrangements to Assess the Degree of Unbalance about Earth." In it, the ratio of an applied longitudinal signal to the resulting unwanted transverse signal is defined as "Longitudinal Conversion Loss (LCL)." The recommended test bridge configuration to measure LCL is shown in FIG. 2.

Although, for the sake of generality, the item under test (IUT) 2 is a two-port network, the measurement can be performed only on one port at a time.

The longitudinal signal, G, is applied to the balanced circuit via a center-tapped auto-transformer. The magnitude of G is measured by voltmeter $V_{L1}$, while voltmeter $V_{T1}$ measures the resulting transverse voltage. $Z_1$ is the characteristic impedance of the balanced circuit. $Z_{L1}$, the common mode source impedance, is specified as $Z_1/4$. $Z_2$ is the termination impedance of the IUT, especially when twisted pair, coaxial cable or other transmission line is tested. The test circuit of FIG. 2 clearly shows the elements required for the balance measurement, which are:

1. Common mode signal source;
2. Common mode signal injection circuit;
3. Balanced line termination; and
4. Transverse voltage monitor.

Aside from showing what has to be measured where, the circuit does not prescribe how to perform the measurement in practice.

A conventional circuit to measure the LCL of a 150 ohm balanced IUT 2 in conjunction with a 50 ohm network analyzer 4 is shown in FIG. 3. It consists of common mode signal injection transformer T1, common mode choke T2 and balun T3. The common mode input signal is terminated in 50 ohm. Balun T3 transforms the 150 ohm balanced IUT impedance to the 50 ohm coaxial input of the network analyzer 4. Since the network analyzer input sees $V_{T2}$ rather than $V_{T1}$, its reading has to be corrected to display $V_{L1}/V_{T1}$.

Among the limitations of the conventional circuit are the following:

It is essential for the bridge to respond only to the transverse signal and not to the common mode signal that may leak through. Therefore, common mode attenuation is crucial. However, much of the load of discriminating against common mode is borne by balun T3, where it is rather difficult to assure superior common mode rejection over the frequency range of interest.

Since there exists a need for longitudinal balance bridges to measure IUTs of different balanced impedances, the conventional circuit will require a multiplicity of balun designs to accommodate this range of impedances.

Calibration to assure accuracy of measurement is rather difficult in the conventional bridge. The correction factor will differ from unit to unit and vary over the frequency range particularly at the high and low ends.

The ITU-T recommendation O.9 also specifies a two-port measurement of longitudinal balance in paragraph 4.3. This measurement is called "longitudinal conversion transfer loss (LCTL)". As mentioned previously, the one-port measurement is known as "longitudinal conversion loss (LCL)".

The measurement configuration for LCTL is shown in FIG. 4.

A common mode signal, $V_{L1}$, is applied to port ab of an item under test (IUT) 2 via a center-tapped auto-transformer. As mentioned previously, in the one-port method of measurement (FIG. 2), the transverse signal, $V_{T1}$, due to unbalance, is measured at the same port ab and the ratio, $V_{L1}/V_{T1}$, is defined as the "longitudinal conversion loss (LCL)".

In the two-port method (FIG. 4), the transverse signal, $V_{T2}$, is measured at port de, and the ratio $V_{L1}/V_{T2}$ is defined as the "longitudinal conversion transfer loss (LCTL)".

OBJECTS AND SUMMARY OF THE INVENTION

It is an object of the present invention to provide a longitudinal balance measuring bridge circuit which can interface directly with a network analyzer to measure the longitudinal conversion loss of a circuit under test.

It is another object of the present invention to provide a longitudinal balance measuring bridge circuit connectable to a network analyzer and to a circuit under test to measure a transverse voltage across the balance terminals of the bridge circuit to which the circuit under test is connected while avoiding any response to the common mode signal applied to the bridge circuit and the circuit under test.

It is yet another object of the present invention to provide a longitudinal balance measuring bridge circuit which has a wide operating bandwidth.

It is a further object of the present invention to provide a longitudinal balance measuring bridge circuit that is easily adaptable for use with circuits under test having different impedance values.

It is yet a further object of the present invention to provide a longitudinal balance measuring bridge circuit which has a high common mode attenuation.

In accordance with one form of the present invention, a longitudinal balance measuring bridge circuit includes a common mode signal injection circuit. The common mode signal injection circuit is coupleable to an item under test (IUT), such as a circuit, including a telecommunications transmission line, such as a twisted pair, and to a source of common mode signal, such as an output signal provided by a network analyzer. The common mode signal injection circuit provides the common mode signal to the IUT, and further has a pair of balanced outputs.

The longitudinal balance measuring bridge circuit further includes a common mode filter. The common mode filter is coupled to the balanced outputs of the common mode signal injection circuit and attenuates the common mode signal. The common mode filter also has balanced outputs on which are provided a transverse signal resulting from the common mode signal provided to the IUT.

The longitudinal balance measuring bridge circuit further includes a signal output balun. The signal output balun is coupled to the balanced outputs of the common mode filter and converts the transverse signal to an unbalanced signal. The unbalanced signal is preferably provided to the input connector of the network analyzer, which analyzer determines the ratio of the common mode signal provided to the IUT and the unbalanced transverse signal in order to derive the longitudinal conversion loss of the IUT.

In accordance with a method of the present invention for measuring the longitudinal conversion loss of an IUT, defined previously, a common mode signal is injected into the IUT, and from this a balanced output signal is generated having a common mode signal component and a transverse signal component. The common mode signal component is attenuated, such as by a common mode filter formed in accordance with the present invention, and the remaining transverse signal component is converted to an unbalanced signal. The unbalanced signal having the transverse signal component is compared by a network analyzer or the like with the injected common mode signal in order to derive therefrom the longitudinal conversion loss of the IUT.

Thus, the longitudinal balance measuring bridge circuit of the present invention is a device which uses a filter to eliminate common mode from the measurement section of the bridge, uses a transformer design with a parallel resistor which allows measurement of any balanced output impedance, the capability to make a one port measurement of a circuit under test if the output end of the balanced circuit under test is not accessible, or a two port measurement if it is. Furthermore, the longitudinal balance measuring bridge circuit of the present invention is a self-calibrating device, which eliminates the effects of differing voltages and the need to apply correction factors to the measurement.

These and other objects, features and advantages of the present invention will be apparent from the following detailed description of illustrative embodiments thereof, which is to be read in connection with the accompanying drawings.

DETAILED DESCRIPTION OF THE PREFERRED EMBODIMENTS

Figure 1:
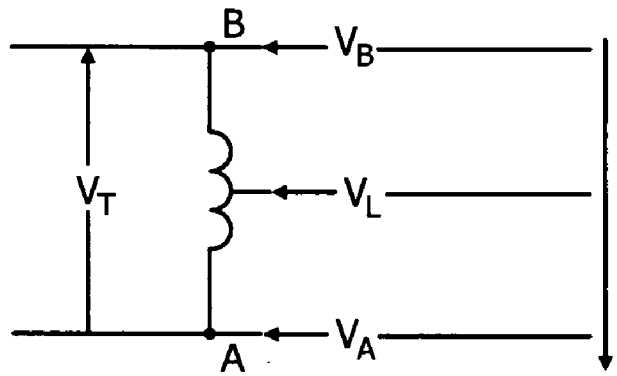
FIG. 1 is a schematic diagram of a conventional balanced circuit, illustrating the relationship of transverse voltage and longitudinal voltage to the circuit.
Figure 2:
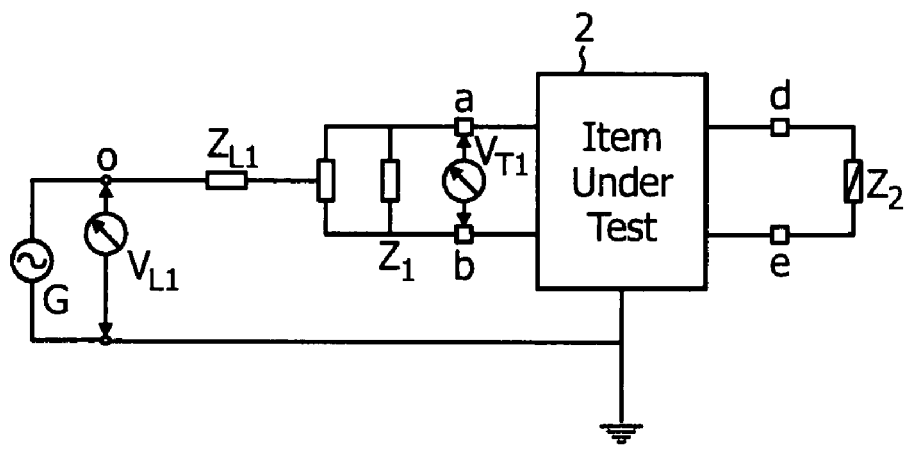
FIG. 2 is a schematic diagram of a conventional bridge circuit for measuring longitudinal conversion loss.
Figure 3:
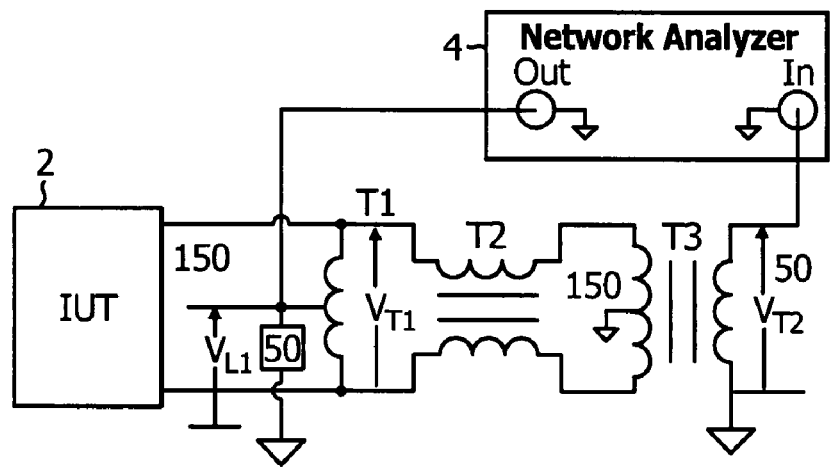
FIG. 3 is a detailed schematic diagram of a conventional bridge circuit for measuring longitudinal conversion loss.
Figure 4:
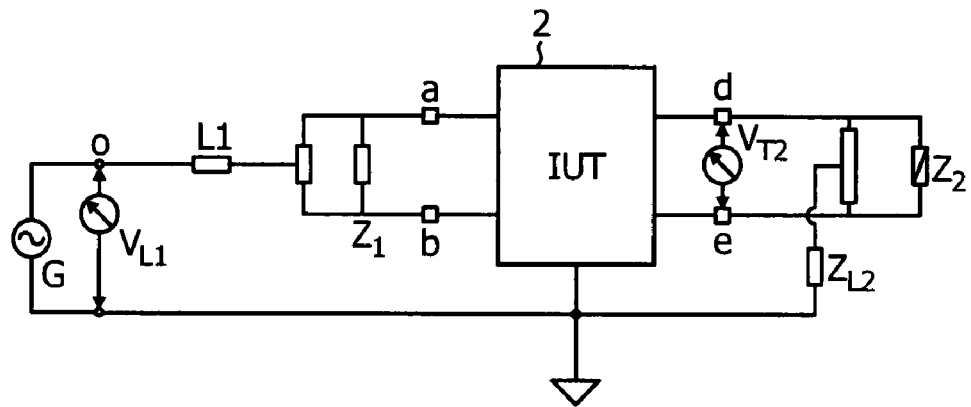
FIG. 4 is a schematic diagram of a conventional bridge circuit for measuring longitudinal conversion transfer loss.
Figure 5:
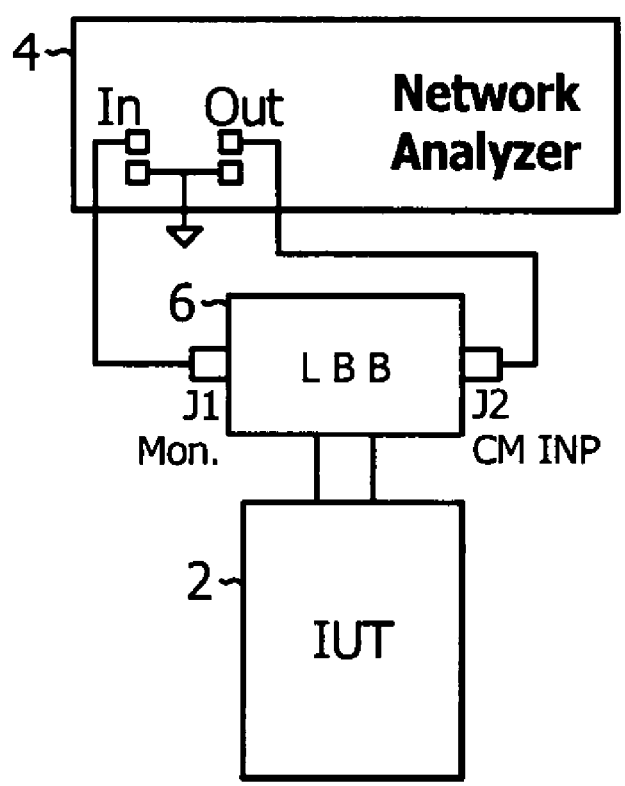
FIG. 5 is a simplified block diagram of a longitudinal balance bridge measuring circuit formed in accordance with the present invention and illustrating the connection thereof to a network analyzer.

The present invention serves the aforementioned purpose most conveniently by combining the above-identified elements one through four in a single package that interfaces directly with a network analyzer 4, as shown in FIG. 5. J2 accepts the common mode input, J1 outputs the resulting transverse signal and the network analyzer 4 computes and displays the ratio of the two.

More specifically, and as shown in FIG. 5 of the drawings, a network analyzer 4, such as Model No. HP8753C, manufactured by Agilent Technologies, Inc. (formerly Hewlett-Packard Company), of Palo Alto, Calif., is connected to the longitudinal balance measuring bridge circuit 6 of the present invention. The output port of the network analyzer 4 is connected to input port J2 of the longitudinal balance measuring bridge circuit 6 of the present invention, where J2 is the common mode signal input port. The input port of the network analyzer 4 is connected to the transverse signal output port J1 of the longitudinal balance measuring bridge circuit 6. The item under test (IUT) 2, which may be a circuit, an electronic device or a signal transmission line, such as twisted pair or coaxial cable, is connected to the longitudinal balance measuring bridge circuit 6 of the present invention as shown in FIG. 5 and as will be described in greater detail.

The function of the new longitudinal balance bridge (LBB) circuit 6 is the measurement of $V_{T1}$, the transverse voltage across the balance terminals, while scrupulously avoiding any response to the common mode signal.

Figure 6:
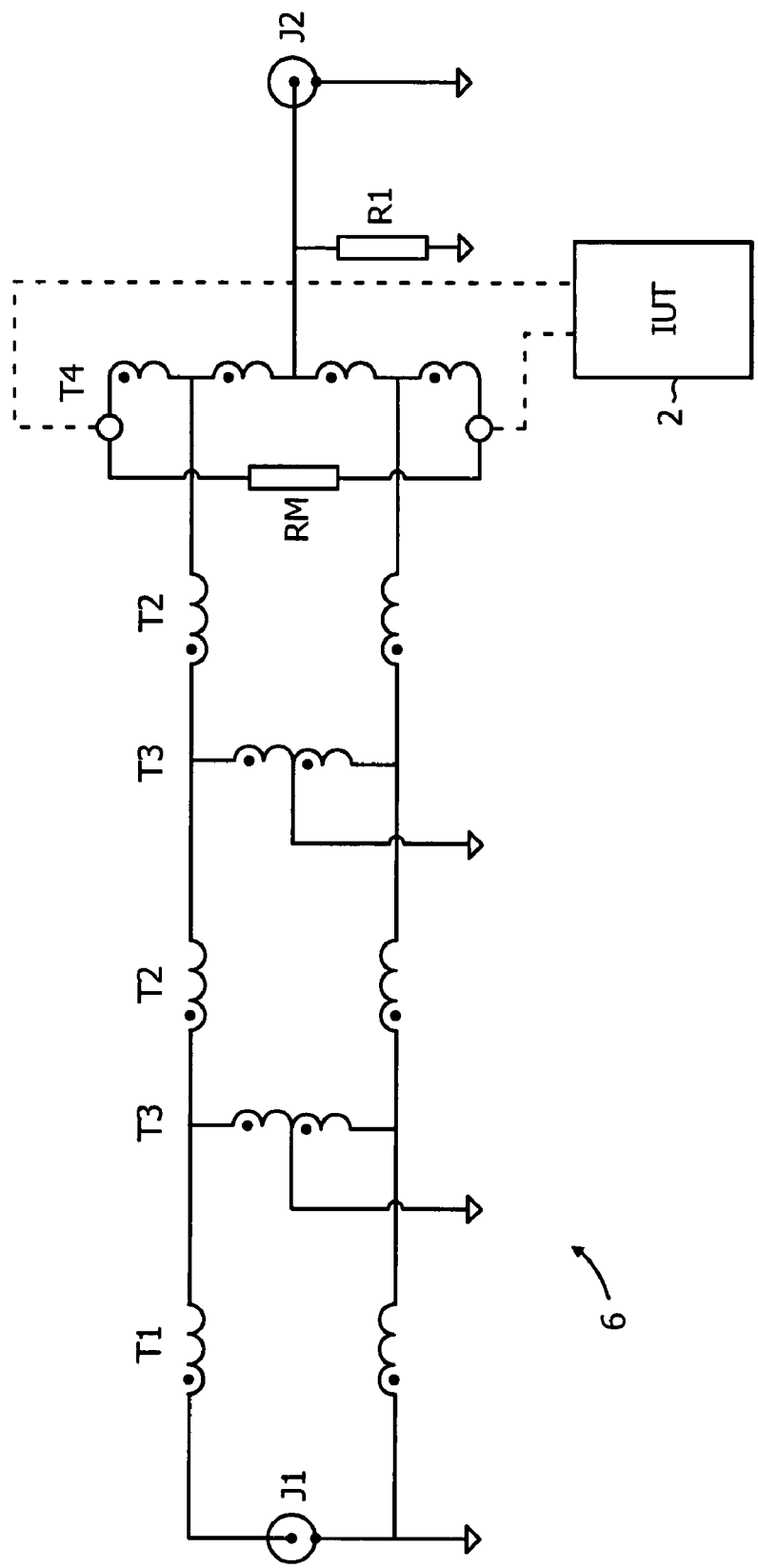
FIG. 6 is a detailed schematic diagram of a longitudinal balance bridge measuring circuit formed in accordance with the present invention.

This has been done in the new bridge circuit configuration of the present invention, one form of which is shown in FIG. 6. Directly across the balanced input is a preferably 200 to 50 ohm balanced matching transformer T4 which also serves as the common mode signal injection circuit. It is followed by preferably a two-stage common mode filter comprised of transformers T3 and T2 and, finally, by a 1:1 balun comprised of transformer T1.

More specifically, and again referring to the schematic diagram of FIG. 6, the invention is comprised of four elements: an output in-line balanced to unbalanced transformer (T1) in series with monitor connector J1; one or more filter stages (T2 and T3) cascaded in series between T1 and T4; T4, a wide band impedance matching transformer with a center tap for the input of the longitudinal signal in series with input connector J2; and a resistor RM connected entirely across (i.e., in parallel with) T4 and being of such value as to match the bridge to the input impedance of the balanced IUT.

T1 converts the transverse signal resulting from a longitudinal signal stimulus applied to a balanced IUT via the center tap of T4 to an unbalanced signal matching the input impedance of the network analyzer. T1 is wound using a twisted pair transmission line of the appropriate characteristic impedance made from magnet wire and with the windings arranged so they are wound in the same direction.

T1 is preceded by one or more filter stages each consisting of an in line transformer (T2) and a shunt transformer (T3). T2 is wound similarly to T1 using a transmission line of the appropriate impedance made from twisted pair magnet wire. These windings are arranged so that they are wound in the same direction. Similarly, the shunt transformer (T3) includes a winding which shunts each wire of the twisted pair transmission magnet wire to ground. These shunt windings are wound in opposite directions to each other using a transmission line consisting of twisted pair magnet wire. One or more stages of filtering can be used depending upon the required operating bandwidth of the bridge.

T4 is a wide band transformer wound as a transmission line transformer using two transmission line magnet wire twisted pairs wound in opposite direction and connected in series as an auto transformer. A resistor R1 is connected between the center conductor of connector J2, the common mode input, and ground and is provided to make the common mode source impedance, $Z_{L1}$, equal to the characteristic impedance, $Z_1$. A resistor RM is connected across the output of T4 having a value appropriate to match the impedance of the balanced IUT to the impedance of the cascaded filters (T2 and T3) and balun T4 and network analyzer 4. It should be noted that T2 and T3 may differ from one stage to another. These transformers would use the same winding technique, but the core material and number of turns may differ to obtain the required performance at frequencies preferably above 300 MHz.

A balun designed to measure longitudinal balance over a wide frequency range extending to hundreds of Megahertz, requires an extremely high degree of common mode rejection. This is difficult to achieve in practice. However, by preceding the input on the balanced side by one or more filter sections as described above, the inherent common mode rejection of the balun is no longer critical and the design is greatly simplified. Further, feeding the filter sections with a 4:1 balanced to balanced transformer, such as T4, achieves an extremely wide bandwidth and while keeping the manufacture of the device simple and consistent. Added features are the input impedance to the filter is lower, resulting in greater common mode attenuation, and multiple balanced impedances can be accommodated using a single shunt resistor substituting different values for different balance networks.

Further details and advantages of the new bridge configuration are as follows:

1. It would present a single design for all values of balanced impedance preferably between about 100 and about 200 ohms. All that needs to be changed are two resistance values RM and R1. There is also no need to design matching transformers which do not necessarily call for convenient turns ratios and, also, different wire sizes for optimum performance of the humbuckers (T2) at the different balanced impedance levels.

2. The preferred 200:50 ohm balanced-to-balanced transformer T4 is preferably a classical Guanella circuit which is well known in the art. It consists of two 100 ohm transmission lines connected in parallel at the 50 ohm end and in series at the 200 ohm end. It is easy to construct, and, as a transmission line transformer, has inherently wide bandwidth and is not subject to the usual limitations of leakage inductance and capacitance. Its input impedance should be a flat 200 ohms when terminated in 50 ohms over a wide frequency range and can be readily checked in a series element test circuit.

3. Since the impedance level through the bridge circuit 6 is now preferably 50 ohms, it should then be much easier to realize a 30 dB/section common mode attenuation which is desired. It should be noted that the series elements, shown as a single humbucker (T2), could actually be two or more in series to supply sufficient impedance over the frequency range.

4. The final element is the balun (transformer T1). It may be a 50 ohm transmission line with not particularly good common mode rejection. That does not matter if the common mode level at its input is below 60 dB. The balanced to unbalanced conversion process causes unequal loading of the two sides of the last common mode filter shunt element (T3): one side sees a reactance in series with the 50 ohm load, the other side the reactance only. The unequal loading produces a transverse signal across the balanced side, which, incidentally, will travel all the way to the balanced input. However, it should be more than 60 dB attenuated.

5. The correction factor is preferably 6 dB due to the signal level drop in the preferred 200:50 ohm transformer plus certain circuit losses.

6. In the final manufactured assembly of the bridge circuit 6, the common mode input and monitor output connectors would preferably be on the opposite faces, with all the components on a small printed circuit board between them.

7. For 75 ohm network analyzers, the same bridge circuit described above may be used, leaving everything as is and merely placing a 150 ohm resistor across the monitor output, and use different common source impedance resistors.

Current implementations of the device have bandwidths to 300 MHz, and devices that extend the frequency range to 1 GHz are in development. It is expected that higher frequency performance can be accomplished by using additional filter sections and transformer core materials with appropriate high frequency characteristics.

Figure 7:
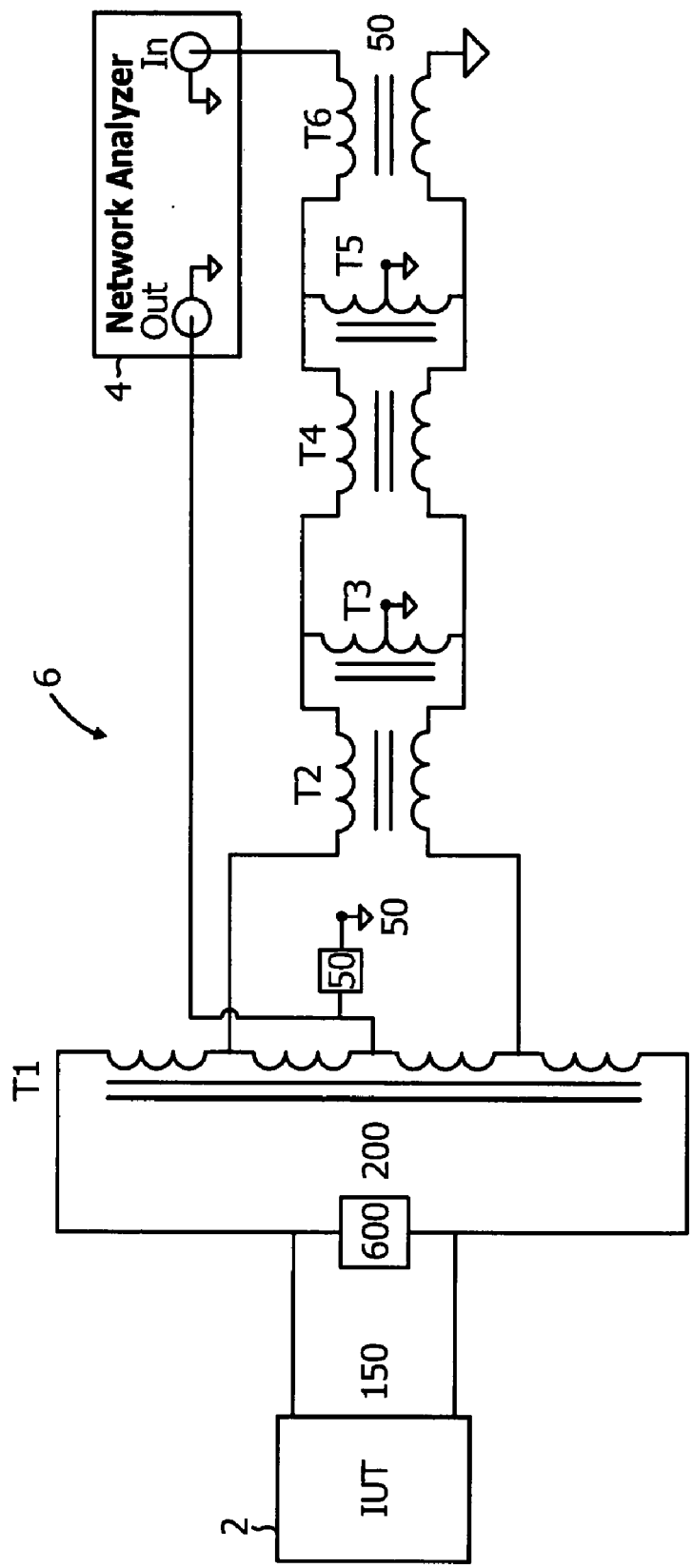
FIG. 7 is a detailed schematic diagram of a longitudinal balance bridge measuring circuit constructed in accordance with another form of the present invention.

Another form of a longitudinal balance measuring bridge circuit 6 of the present invention is illustrated in FIG. 7. It includes a balanced-to-balanced transmission transformer T1, two common mode filter sections T2/T3 and T4/T5 and transmission line balun T6, in much the same way as the bridge circuit of the present invention shown in FIG. 6.

Transformer T1 provides a four to one impedance ratio which is optimal from a design point view. It converts a 200 ohm balanced impedance to 50 ohm balanced. Different line impedances are accommodated by addition of an appropriate shunt resistor. The 150 ohm unit of FIG. 7 requires a 600 ohm resistor across the input.

Common mode attenuation is provided at the 50 ohm level which reduces the inductance requirements of the shunt elements. The filters are similar in many respects to the circuit disclosed in U.S. Pat. No. 5,095,291, the disclosure of which is incorporated herein by reference. The number of sections may be increased or decreased to meet the requirements of different frequency ranges.

Once the common mode level has been reduced to a negligible level, the requirement of common mode rejection by the 1:1 balun (T6) to couple to the network analyzer 4 is greatly reduced. In the case of the circuit of FIG. 7, that balun (T6) is preferably a simple transmission line type consisting of a single twisted pair line.

Figure 8:
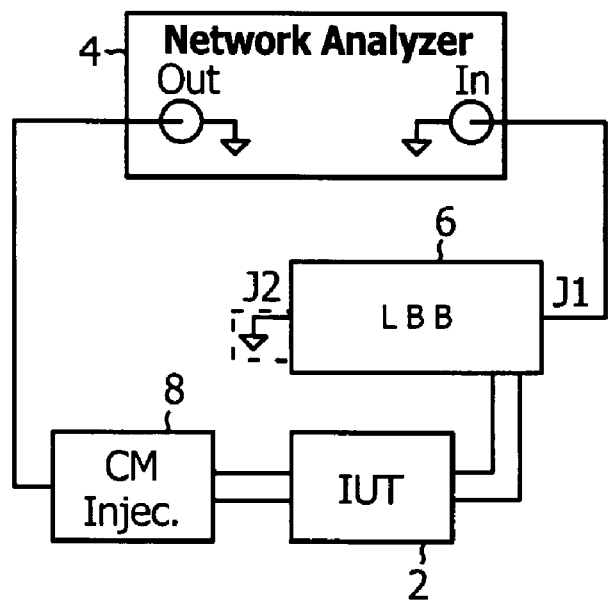
FIG. 8 is a simplified block diagram of a longitudinal balance bridge measuring circuit formed in accordance with the present invention and illustrating the connection thereof to a network analyzer for measuring the longitudinal conversion transfer loss of an item under test.
Figure 9:
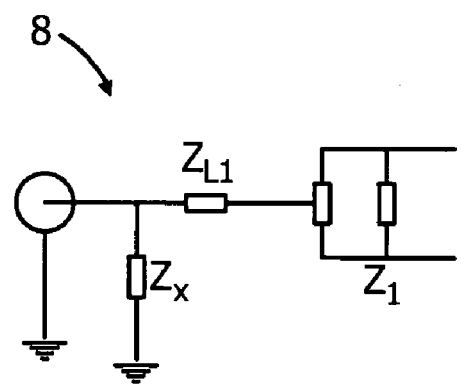
FIG. 9 is a simplified schematic diagram of a common mode signal injection circuit for use with the longitudinal balance bridge measuring circuit of the present invention when measuring longitudinal conversion transfer loss.

The longitudinal balance measuring bridge circuit 6 of the present invention may also be used in a two-port balance measurement to determine the longitudinal conversion transfer loss (LCTL). Such an LCTL measuring circuit is shown in FIG. 8 of the drawings. In the two-port longitudinal balance bridge test circuit 6, the input port of the network analyzer 4, such as described previously with respect to the one-port longitudinal balance bridge test circuit shown in FIG. 5, is connected to the transverse signal output port J1 of the longitudinal balance measuring bridge circuit of the present invention, such as shown in FIG. 6 of the drawings. The common mode signal input port J2 of the longitudinal balance measuring bridge circuit is grounded. The item under test (IUT) 2 is connected to the longitudinal balance measuring bridge circuit 6 in the same manner as described previously and shown in FIG. 6 of the drawings. However, in the two-port longitudinal balance bridge test circuit 6, a separate common mode signal injection circuit 8 is connected to the other ports of the IUT (available ports), and to the output port of the network analyzer, as shown in FIG. 8 of the drawings. A common mode signal injection circuit 8 which may be used in conjunction with the longitudinal balance measuring bridge circuit 6 of the present invention is shown in FIG. 9 of the drawings.

In the two-port measuring configuration, common mode impedance to ground will, in general, be equal to $Z_L/2$. That impedance in parallel with $Z_X$ should be preferably 50 ohms. For an impedance $Z_L$ of 100 ohms, no shunt impedance $Z_X$ is included. A calibration and measurement procedure for use with the longitudinal balance bridge measuring circuit of the present invention will now be described. The method of calibration dispenses with the need for correction factors. A test termination is provided that provides a known value of unbalance. In the calibration procedure with the termination in place, the display trace is first normalized to zero and then set to the given unbalance value. In subsequent measurements the display will read the longitudinal conversion loss (LCL) directly without any corrections.

More specifically, the network analyzer 4, such as Model No. HP8753C described previously, is first calibrated by having its output port connected to its input port, and the display is set to have 10 dB/division, with the trace situated at the top of the display. Then, the output of the network analyzer 4 is connected to the common mode signal input port J2 of the longitudinal balance measuring bridge circuit 6 of the present invention, and the input port of the network analyzer is connected to the transverse signal output port J1 of the longitudinal balance measuring bridge circuit.

The display of the analyzer 4 is then normalized, and the trace is moved to −30 dB. The analyzer marker should then be offset by 30 dB.

The test termination is then removed, and the item under test (IUT) 2 is connected to the balanced terminals of the longitudinal balance measuring bridge circuit to measure the longitudinal balance of the IUT.

The longitudinal balance measuring bridge circuit 6 of the present invention measures the ratio of a common mode (longitudinal) applied signal to the transverse signal resulting from imperfect balance of an item under test (IUT) 2. Preferably, the common mode signal input port J2 and the transverse signal output port J1 of the longitudinal balance measuring bridge circuit 6 of the present invention are industry standard female BNC-type connectors. The balanced test terminals are preferably sockets to connect to the IUT.

Although illustrative embodiments of the present invention have been described herein with reference to the accompanying drawings, it is to be understood that the invention is not limited to those precise embodiments, and that various other changes and modifications may be effected therein by one skilled in the art without departing from the scope or spirit of the invention.

What is claimed is:

1. A longitudinal balance measuring bridge circuit, which comprises:
   a common mode signal injection circuit, the common mode signal injection circuit being coupleable to an item under test (IUT) and to a source of common mode signal and providing the common mode signal to the IUT, the common mode signal injection circuit having balanced outputs;
   a common mode filter, the common mode filter being coupled to the balanced outputs of the common mode signal injection circuit and attenuating the common mode signal, the common mode filter having balanced outputs on which are provided a transverse signal resulting from the common mode signal provided to the IUT; and
   a signal output balun, the signal output balun being coupled to the balanced outputs of the common mode filter and converting the transverse signal to an unbalanced signal.

2. A longitudinal balance measuring bridge circuit as defined by claim 1, wherein the common mode signal injection circuit includes a balanced matching transformer.

3. A longitudinal balance measuring bridge circuit as defined by claim 2, wherein the transformer of the common mode signal injection circuit is a 4:1 balanced matching transformer.

4. A longitudinal balance measuring bridge circuit as defined by claim 3, wherein the 4:1 balanced matching transformer is a 200 ohm to 50 ohm transformer.

5. A longitudinal balance measuring bridge circuit as defined by claim 2, wherein the balanced matching transformer is a Guanella circuit.

6. A longitudinal balance measuring bridge circuit as defined by claim 1, wherein the common mode signal injection circuit is a wide band, impedance matching transformer having a center tap input on which is provided the common mode signal, the impedance matching transformer providing the common mode signal to the IUT.

7. A longitudinal balance measuring bridge circuit as defined by claim 1, wherein the common mode signal injection circuit includes a balanced to balanced transformer circuit.

8. A longitudinal balance measuring bridge circuit as defined by claim 1, wherein the common mode filter includes at least one filter stage, the at least one filter stage having an in-line transformer and a shunt transformer coupled to the in-line transformer and to ground.

9. A longitudinal balance measuring bridge circuit as defined by claim 8, wherein the in-line transformer includes a wound twisted pair of transmission line of a selected impedance.

10. A longitudinal balance measuring bridge circuit as defined by claim 9, wherein the wound twisted pair of transmission line of the in-line transformer includes a pair of wires which are wound in the same direction with respect to one another.

11. A longitudinal balance measuring bridge circuit as defined by claim 9, wherein the shunt transformer includes a wound twisted pair of transmission line of a selected impedance.

12. A longitudinal balance measuring bridge circuit as defined by claim 11, wherein the wound twisted pair of transmission line of the shunt transformer includes a pair of wires which are wound in opposite directions with respect to one another.

13. A longitudinal balance measuring bridge circuit as defined by claim 8, wherein the common mode filter provides at least 30 dB (decibels) of common mode attenuation.

14. A longitudinal balance measuring bridge circuit as defined by claim 8, wherein the at least one filter stage provides about 30 dB (decibels) of common mode attenuation.

15. A longitudinal balance measuring bridge circuit as defined by claim 8, wherein the common mode filter includes a first filter stage and at least a second filter stage, the first filter state and the at least second filter stage being cascaded in series.

16. A longitudinal balance measuring bridge circuit as defined by claim 15, wherein each of the first filter stage and the at least second filter stage has an in-line transformer and a shunt transformer coupled to the in-line transformer and to ground.

17. A longitudinal balance measuring bridge circuit as defined by claim 1, wherein the signal output balun includes an in-line balanced to unbalanced transformer circuit.

18. A longitudinal balance measuring bridge circuit as defined by claim 1, wherein the signal output balun includes a transformer, the transformer including a wound twisted pair of transmission line of a selected impedance.

19. A longitudinal balance measuring bridge circuit as defined by claim 18, wherein the wound twisted pair of transmission line of the transformer of the signal output balun includes a pair of wires which are wound in the same direction with respect to one another.

20. A longitudinal balance measuring bridge circuit as defined by claim 1, which further comprises a matching resistive circuit coupled in parallel with the balanced outputs of the common mode signal injection circuit, the matching resistive circuit having an impedance selected in order to match the impedance of the bridge circuit to the input resistance of the IUT.

21. A method of measuring the longitudinal conversion loss of an item under test (IUT), which comprises:

injecting a common mode signal into the IUT and generating therefrom a balanced output signal having a common mode signal component and a transverse signal component;

attenuating the common mode signal component;

converting the transverse signal component to an unbalanced signal; and comparing the unbalanced signal having the transverse signal component with the injected common mode signal to derive therefrom the longitudinal conversion loss of the IUT.

* * * * *